United States Patent [19]

Takahashi et al.

[11] Patent Number: 5,311,048
[45] Date of Patent: May 10, 1994

[54] SEMICONDUCTOR INTEGRATED CIRCUIT DEVICE

[75] Inventors: Toshiro Takahashi, Ohme; Kazuo Koide, Iruma, both of Japan

[73] Assignee: Hitachi, Ltd., Tokyo, Japan

[21] Appl. No.: 738,133

[22] Filed: Jul. 31, 1991

[30] Foreign Application Priority Data

Aug. 21, 1990 [JP] Japan .................. 2-220337

[51] Int. Cl.⁵ .................. H01L 27/10; H01L 27/15
[52] U.S. Cl. .................. 257/207; 257/547; 257/401; 257/368
[58] Field of Search .................. 357/40, 41, 45, 47, 357/48, 50; 257/202, 207, 203, 204, 547, 208, 401, 390, 201, 296, 368

[56] References Cited

U.S. PATENT DOCUMENTS 3,971,001  7/1976  Lodi .................. 340/173

FOREIGN PATENT DOCUMENTS

| | | | |
|---|---|---|---|
| 62-98762 | 5/1987 | Japan | 257/203 |
| 63-179544 | 7/1988 | Japan | 257/203 |
| 1-18239 | 1/1989 | Japan | 357/45 |
| 1-42165 | 2/1989 | Japan | 357/44 |
| 2-2155 | 1/1990 | Japan | 357/48 |
| 2-86166 | 3/1990 | Japan | 257/204 |

*Primary Examiner*—Jerome Jackson
*Assistant Examiner*—D. Monin
*Attorney, Agent, or Firm*—Antonelli, Terry, Stout & Kraus

[57] ABSTRACT

Herein disclosed is a semiconductor integrated circuit device, in which a buffer circuit having a MISFET of a second conduction type and arranged in a first region of the principal plane of a semiconductor substrate of a first conduction type is supplied with a first supply voltage and in which an internal circuit having a complementary MISFET and arranged in a second region of the principal plane of the semiconductor substrate different from the first region is supplied with a second supply voltage independent of the first supply voltage at least over the semiconductor substrate and having a potential equal to that of the first supply voltage. The MISFET of the buffer circuit is formed in the principal plane of a well region of a first conduction type formed in the principal plane of the semiconductor substrate. Between the well region of the first conduction type and the semiconductor substrate, there is formed a separating region for separating the two electrically.

8 Claims, 7 Drawing Sheets

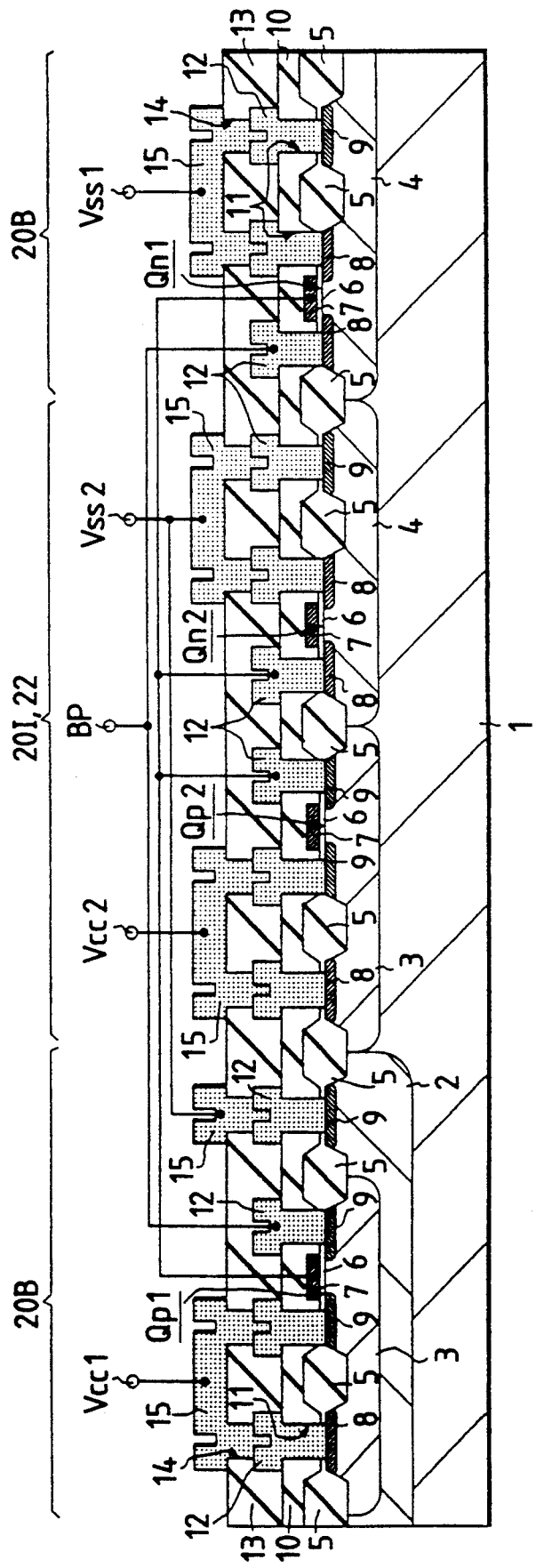

SEMICONDUCTOR INTEGRATED CIRCUIT DEVICE

BACKGROUND OF THE INVENTION

The present invention relates to a semiconductor integrated circuit device and, more particularly, to a technology which is effective when applied to a semiconductor integrated circuit device including a buffer circuit and an internal circuit having a complementary MISFET.

There has been developed the ASIC (as abbreviated from Application Specific Integrated Circuit). The ASIC is generally arranged with an internal circuit such as a logic circuit or a memory circuit at the central region of the circuit packaging plane of a semiconductor substrate. In the peripheral region of the circuit packaging plane of the aforementioned semiconductor substrate, there is arranged a buffer circuit which is used as an interface circuit for an internal device. The peripheral region of the buffer circuit is further arranged with external terminals (or bonding pads).

The aforementioned ASIC has its internal circuit arranged in a matrix form with a plurality or basic cells as the minimum functional block unit for repetitions and further with a circuit which is composed of the basic cells or their combination. Generally, the basic cell of the ASIC is composed of one or more complementary MOSFETs (i.e., CMOS) with a view to increasing the integration and reducing the power consumption. The wiring lines between the individual complementary MOSFETs of the basic cells and between the circuits composed of the basic cells are made mainly of aluminum. These wiring lines themselves are automatically laid out by the DA (as abbreviated from Design Automation) system using a computer.

The aforementioned buffer circuit is composed of buffer circuit cells having a plurality of MOSFETs and is constructed by wiring the individual MOSFETs of the buffer circuit cells like the basic cells.

The aforementioned ASIC is constructed such that each of the input buffer circuits of the internal circuit and the buffer circuit is composed mainly of the complementary MOSFETS. On the other hand, the output buffer circuit of the buffer circuit is composed of a push-pull circuit. This push-pull circuit is arranged by connecting two n-channel MOSFETs in series between a reference supply voltage and an operating supply voltage. The reference supply voltage is set to 0 V, acting as the earth potential of the circuit, in a case in which a system having the ASIC incorporated thereinto uses a single supply voltage of 5 V.

The aforementioned push-pull circuit is featured by a high latch-up withstand voltage because it does not constitute a parasitic thyristor unlike the complementary MOSFET. Moreover, the push-pull circuit has such a high latch-up withstand voltage, as described above, that it can reduce the pitch between the individual MOSFETs to reduce the area to be occupied to an extent corresponding to the reduction of the pitch. In other words, the push-pull circuit is featured in that it can reduce the area to be occupied by the output buffer circuit thereby t improve the degree of integration of the ASIC. Since, however, the push-pull circuit experiences a voltage drop corresponding to the threshold voltage of the n-channel MOSFET, its output voltage takes a value which is calculated by subtracting the threshold voltage of the n-channel MOSFET from the supply potential.

On the other hand, the aforementioned ASIC is used in various applications for packaging a CPU or aiding the CPU of an external device as the degree of integration becomes greater or the multiple terminals progresses to a higher requirement. The ASI to be used for such application is arranged with a bus which is composed of a number of signal wiring lines for transmitting data between the circuits. As a result, the ASIC outputs a number of data such as 32 bits or 64 bits simultaneously via the bus line from the output buffer circuits. At the same time, the numerous data are simultaneously inputted from the external devices via the input buffer circuits.

In a case in which the aforementioned ASIC is packaged in the PGA structure, for example, and incorporated into the system, noises result in the supply voltages to be fed to the individual output buffer circuits, if the numerous output buffers are simultaneously operated. Such noises produce the phenomena in which the supply voltages to be instantly supplied to the output buffer circuits fluctuate on the basis of the inductance or resistance components specific to the supply voltage wiring lines (of aluminum) for supplying the supply voltages to the output buffer circuits, the wires in the package, and the external pins. On the other hand, the aforementioned noises are not intrinsic to the case in which the ASIC is packaged in the PGA structure but may occur in the case of a package of another structure. The noises produced in the aforementioned supply voltages would result in malfunctions in the internal circuits, such as loss of stored data of a flip-flop circuit when the supply voltage to be supplied to the flip-flop circuit of the internal circuit is common to that to be supplied to the output buffer circuit.

As counter-measures for such noises, it is effective to separate and isolate the supply voltage (e.g., the reference supply voltage and the operating supply voltage) to be supplied to the internal circuit of the ASIC and the supply voltage to be supplied to the buffer circuit. These supply voltages separated from each other are shared outside of the ASIC, i.e., in the system to be packaged with the ASIC.

SUMMARY OF THE INVENTION

Prior to the development of the ASIC, we have found out the following problems.

The ASIC adopts an operating supply voltage of 3.3 V when the minimum machining size of the gate length of the MOSFET in the fabrication process reaches the order of sub-microns, e.g., 0.3 to 0.8 $\mu$m in accordance with the development of the fine machining technology. This adoption of the voltage dropping supply voltage (e.g., reduced potential supply voltage) is effected to retain the withstand voltage of the MOSFET.

The push-pull circuit or the output buffer circuit of the aforementioned ASIC causes a voltage drop corresponding to the threshold voltage when a load is being charged, so that the output signal takes a high level equal to or lower than 3 V in case the voltage dropping supply voltage is adopted. In other words, the ASIC cannot perform the interface at a high general-purpose TTL (as abbreviated from Transistor coupled Transistor Logic) level if the push-pull circuit is adopted as the output buffer circuit and if the voltage dropping supply voltage (e.g., reduced potential supply voltage) is adopted. The interface at the TTL level is at the high level of about 3.3 V and at the low level of about 0 V.

As a result, the interface at the TTL level cannot be realized unless an inverter circuit composed of complementary MOSFETs is adopted as the output buffer circuit of the ASIC. Since the p-channel MOSFET of the complementary MOSFETs does not experience the voltage drop corresponding to the threshold voltage when the load is being charged, the high level of the output signal is equalized to the supply level of the voltage dropping supply voltage.

In the case, however, when the output buffer circuit of the ASIC is composed of complementary MOSFETs, the noises in the supply voltage resulting from operating the output buffer circuit are propagated to the semiconductor substrate. Specifically, when a p-type semiconductor substrate is adopted, noise production in the reference supply voltage, to be supplied to an n-channel MOSFET, is caused by operating the n-channel MOSFET which is formed in the principal plane (main surface) of the p-type semiconductor substrate. Since the reference supply voltage is likewise fed to the p-type semiconductor substrate, such noises are also present in the p-type semiconductor substrate. In the case, on the other hand, of a p-type semiconductor substrate and a p-type well region, the noises are likewise present in the p-type well region. Since the p-type well region and the p-type semiconductor substrate are of identical conductivity type and are electrically connected, such noise present in the p-type well region is propagated to the p-type semiconductor substrate. Similar results also occur if an n-type semiconductor substrate is adopted. The semiconductor substrate, in which the noises are caused at the region of the output buffer circuit, experiences a potential difference from the p-type semiconductor substrate or the p-type well region of the complementary MOSFETs of the internal circuit arranged in the vicinity of the output buffer circuit. This potential difference is established because the reference supply voltages to be supplied to the complementary MOSFET of the internal circuit, the p-type semiconductor substrate or the p-type well region, the output buffer circuit, and the p-type semiconductor substrate of that region o the p-type well-region are separated and isolated from each other. As a result, the current effected by the aforementioned potential difference results in the trigger current for a parasitic thyristor which is composed of the complementary MOSFETs of the output buffer circuit or the complementary MOSFETs of a nearby internal circuit in which breakdown of the ASIC occurs as a result of the latch-up effected.

The present invention has the following objects: (1) To provide a technology capable of improving the latch-up withstand voltage of a semiconductor integrated circuit device, in which the supply voltages to be supplied to an internal circuit, having complementary MISFETs, and a buffer circuit are independent of each other;

(2) To achieve the aforementioned object (1) and to provide a technology capable of extending the range of the operating voltage of said buffer circuit;

(3) To achieve the aforementioned object (2) and to provide a technology capable of improving the degree of integration of the semiconductor integrated circuit device by reducing the area to be occupied by said output buffer circuit;

(4) To achieve any of the aforementioned objects (1) to (3) and to provide a technology capable of improving the degree of integration of the semiconductor integrated circuit device by reducing the area to be occupied by said internal circuit; and (5) To achieve any of the aforementioned objects (1) to (4) and to provide a technology capable of freely setting the level of the supply voltage to be supplied to said output buffer circuit.

The aforementioned and other objects and novel features of the present invention will become apparent from the following description to be made with reference to the accompanying drawings.

Representative aspects of the invention to be disclosed herein will be summarized in the following.

(1) There is provided a semiconductor integrated circuit device, in which a buffer circuit having a MISFET of a second channel conductivity type and arranged in a first region of the principal plane of a semiconductor substrate of a first conductivity type is supplied with a first supply voltage and in which an internal circuit having complementary MISFETs and arranged in a second region of the principal plane of said semiconductor substrate, different from said first region, is supplied with a second supply voltage independent of said first supply voltage at least over said semiconductor substrate and having a potential equal to that of said first supply voltage, wherein the improvement resides: in that the MISFET of said buffer circuit is formed in the principal plane of a well region of a first conductivity type formed in the principal plane of said semiconductor substrate; and in that there is formed between said well region of the first conductivity type and said semiconductor substrate a separating region for isolating the two electrically.

(2) The separating region of the aforementioned means (1) is made of a semiconductor region of a second conductivity type surrounding said well region of the first conductivity type and a supply voltage (to be supplied to said internal circuit) is supplied to said semiconductor region of the second conductivity type to thereby effect a backward bias (or reverse bias) to said well region of the first conductivity type and said semiconductor substrate.

(3) The buffer circuit of the aforementioned means (1) or (2) includes complementary MISFETs composed of said MISFET of the second channel conductivity type and another MISFET of a first channel conductivity type, opposite to said second channel conductivity type.

(4) The complementary MISFETs of said buffer circuit of the aforementioned means (3) has the second channel conductivity type MISFET thereof formed in the principal plane of said well region of the first conductivity type and the first channel conductivity type MISFET thereof formed in the principal plane of said second conductivity type well region, and wherein said separating region is formed only between said first conductivity type well region and said semiconductor substrate.

(5) The separating region is formed only between the well region of the first conductivity type, formed with the second channel conductivity type MISFET of said buffer circuit of any of the aforementioned means (1) to (4), and said p⁻-type semiconductor substrate 1 but not between the second channel conductivity type MISFET of the complementary MISFETs of said internal circuit and said semiconductor substrate.

(6) The buffer circuit of any of the aforementioned means (1) to (5) is arranged in plurality in the first region of the principal plane of said semiconductor substrate, and the individual separating regions of the respectively adjacent ones of said plurality of buffer circuits are integrally formed.

(7) The buffer circuit of any of the aforementioned means (1) to (5) is arranged in plurality in the first region of the principal plane of the semiconductor substrate, and that said plurality of buffer circuits have their individual first conductivity type well regions or first conductivity type well regions and second conductivity type well region separated from one another, or that each and every one of a predetermined number of said plurality of buffer circuits have their first conductivity type well regions or first conductivity type well region and second conductivity type well region integrally formed such that respective integrally formed well regions or said first conductivity type well region and second conductivity type well region are separated from one another, so that each and every one of the separated first conductivity type well regions or said first conductivity type well region and said second conductivity type well region are independently supplied with said first supply voltage.

According to the aforementioned means (1), when noises (or fluctuations in the potential) are produced in the first supply voltage during operation of said buffer circuit, the trigger currents which flow through the first conductivity type well region and the semiconductor substrate on the basis of the potential difference between the first and second supply voltages can be shielded by the separating region so that the start of the parasitic thyristor composed of the semiconductor substrate and the complementary MISFETs of the internal circuit can be suppressed thereby improving the latch-up withstand voltage of the semiconductor integrated circuit device.

According to the aforementioned means (2), the second conductivity type separating region supplies the second supply voltage, which has less noises and is more stable than the first supply voltage which encounters noise during operation of the buffer circuit, so that the shielding ability of the trigger current can be enhanced to improve the latch-up withstand voltage of the semiconductor integrated circuit device.

According to the aforementioned means (3), any voltage drop corresponding to the threshold voltage occurs at the high level side of the output signal level of the complementary MISFETs of the buffer circuit so that the range of the operating voltage can be extended especially in the case where the buffer circuit is the output buffer circuit. As a result, the interface at the TTL level can be realized in the case where the high level of the first supply voltage to be supplied to the output buffer is dropped to 3.3 V.

According to the aforementioned means (4), the second conductivity type well region is basically isolated electrically from the semiconductor substrate so that a separating region therefor can be omitted. As a result, the area to be occupied by the buffer circuit can be reduced to an extent corresponding to the omitted separating region thereby improving the degree of integration of the semiconductor integrated circuit device.

According to the aforementioned means (5), the first conductivity type well region of the buffer circuit acting as a source for generating the trigger current is electrically isolated from the semiconductor substrate to improve the latch-up withstand voltage in the region of the internal circuit. As a result, the separating region in the region of the internal circuit is omitted so that the area to be occupied by the internal circuit can be reduced to a extent corresponding to the omitted separating region thereby improving the degree of integration of the semiconductor integrated circuit device.

According to the aforementioned means (6), the spaced region between the individual separating regions of each one of the plurality of buffer circuits is omitted so that the area to be occupied by the first region (i.e., the region to be arranged with the buffer circuits) of the principal plane of the semiconductor substrate can be reduced to improve the degree of integration of the semiconductor integrated circuit device.

According to the aforementioned means (7) when the plurality of buffer circuits are simultaneously operated, noises resulting in the first supply source are scattered at every separation of the first conductivity type well region or the first conductivity type well region and the second conductivity type well region so that, in effect, the scattered noises can be reduced. As a result, the trigger current can be reduced to thereby improve the latch-up withstand voltage of the semiconductor integrated circuit device. Moreover, individual ones of the plurality of buffer circuits or each and every group consisting of a predetermined number of the plurality of buffer circuits are separated and electrically isolated through the separating region and the semiconductor substrate so that the levels of the first supply voltage to be supplied to the individual ones of the plurality of buffer circuits can be set to a plurality of kinds (e.g. different voltage levels). In other words, the semiconductor integrated circuit device can be given a plurality ranges of operating voltages.

BRIEF DESCRIPTION OF THE DRAWINGS

FIG. 7 is a cross-sectional view showing an essential portion of the ASIC according to Embodiment II of the present invention.

DESCRIPTION OF THE PREFERRED EMBODIMENTS

Figure 1:
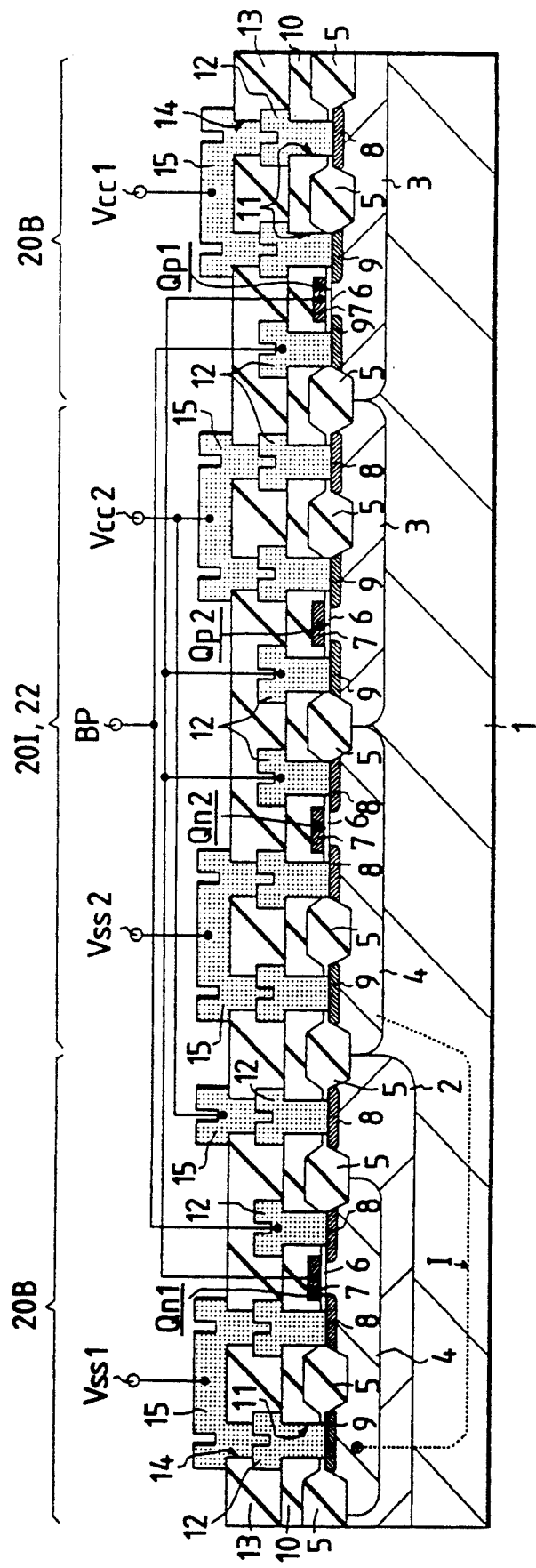
FIG. 1 is a cross-sectional view showing an essential portion of the ASIC according to Embodiment I of the present invention.

A description of the structure according to the present invention will be described in connection with the disclosed embodiments applied to the ASIC.

Incidentally, throughout the drawing figures for describing the embodiments, the parts having identical functions are designated with identical reference numerals, and their repeated descriptions will be omitted.

Embodiment I

Figure 2:
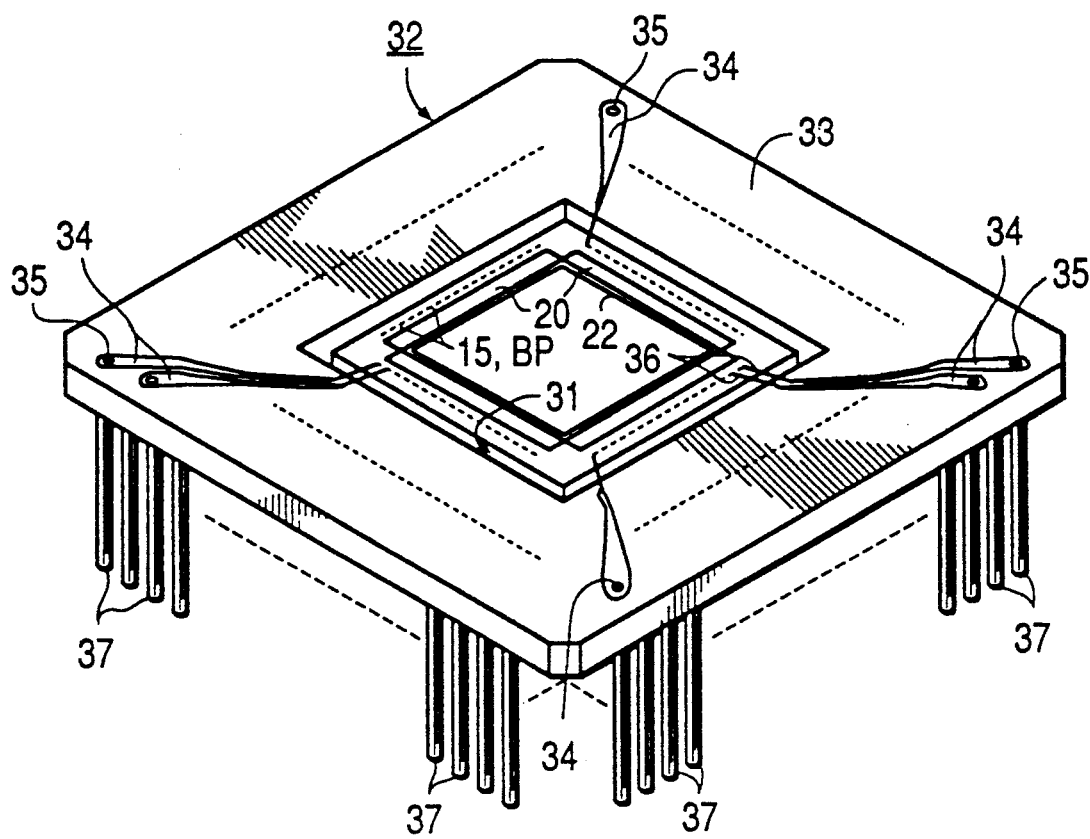
FIG. 2 is a perspective view showing the ASIC and its package.

The ASIC according to Embodiment I of the present invention and its package are schematically shown in FIG. 2 (of perspective view).

As shown in FIG. 2, the ASIC (or the semiconductor chip) 31 is packaged at 32 to adopt the PGA structure.

This package 32 is composed mainly of a base substrate 33, metallized wiring lines 34, through hole wiring lines 35 and external pins 37. Although not shown in FIG. 2, the ASIC 31 in the package 32 is sealed up by a sealing member such as a sealing cap or resin.

The base substrate 33 is made of a flat square ceramic (or resin) substrate to package the ASIC 31 in the cavity at the center of its packaging face. The packaging face of the base substrate 33 is arranged therearound with a plurality of metallized wiring lines 34 which are led from the center to the periphery. These metallized wiring lines 34 are made of Cu or Al. The metallized wiring lines 34 are electrically connected at their ends at the side of the ASIC 31 with external terminals (or bonding pads PP) 15 of the ASIC 31. The individual connections of the ASIC 31 with the external terminals 15 ar accomplished by bonding wires 36. These bonding wires 36 used are made of Au, for example. The other ends of the metallized wiring lines 34 are electrically connected with the external pins 37. These external pins 37 are arranged in plurality at the face opposed to the packaging face of the base substrate 33. The number of the external pins 37 are several tens or hundreds, for example. The individual connections of the external pins 37 and the metallized wiring lines 34 at the other side are accomplished through the through hole wiring lines 35 which are formed in the inner wall of the not-shown through holes of the base substrate 33.

The package 32 of this ASIC 31 is packaged in the circuit system mounted in the package substrate such as PCB and is installed in this circuit system.

Next, the structure of the ASIC in the package 32 adopting the PGA structure will be briefly described with reference to FIG. 3 (presenting the chip layout).

Figure 3:
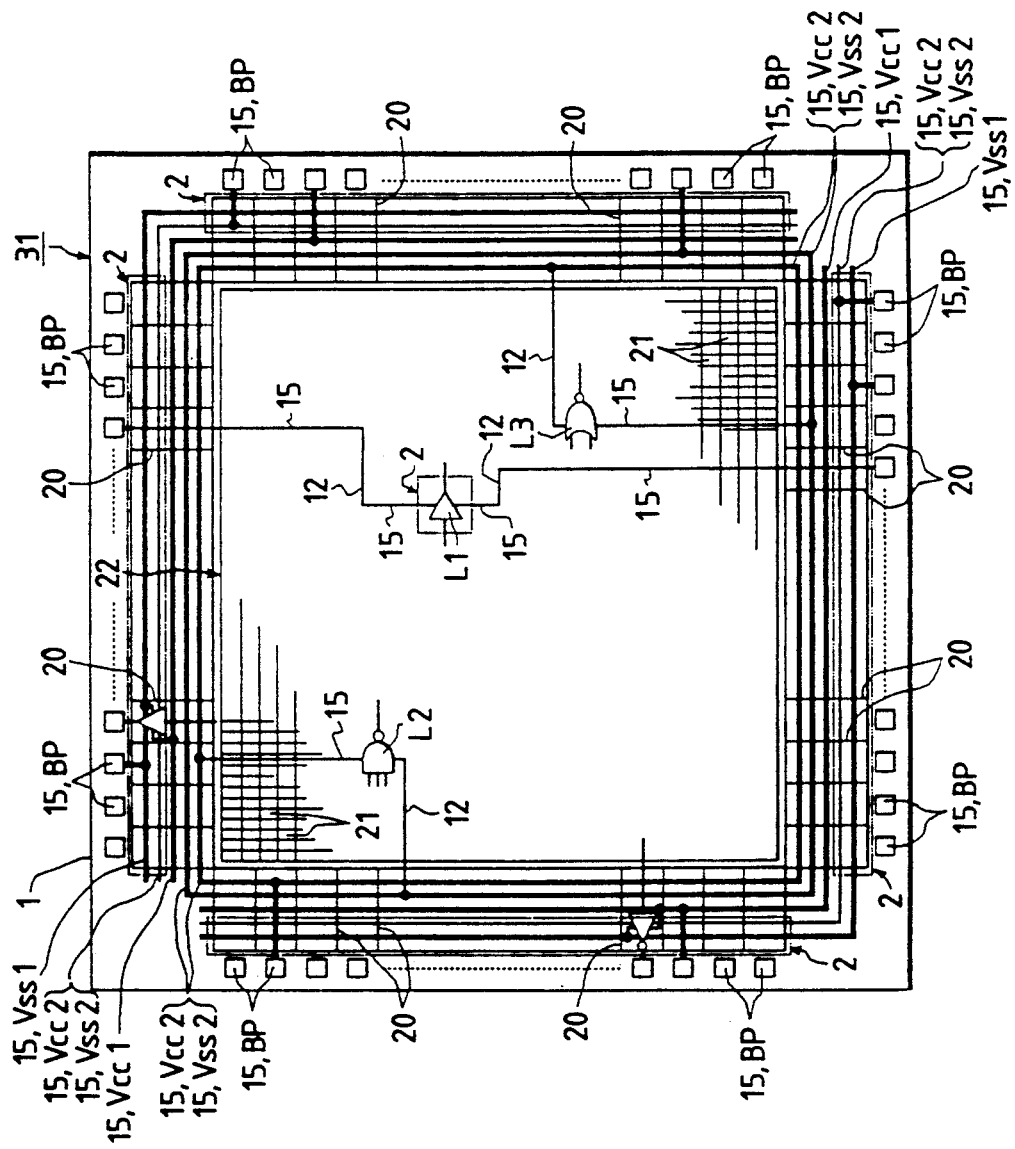
FIG. 3 is a layout showing the chip of the ASIC.

As shown in FIG. 3, the ASIC 31 is constructed mainly of a p-type semiconductor substrate 1 which is formed into a square shape in a top plan view and made of single crystal silicon. This ASIC 31 is arranged with a plurality of external terminals (BP) 15 in the peripheral regions along the sides of the square. The ASIC 31 of the present embodiment adopts the two-layered wiring structure, although the number of layers is not limited. Each of the two layers of this wiring structure is made of wiring lines of an aluminum alloy, for example. These wiring lines of aluminum alloy are made of aluminum containing additional Cu or Cu and Si. The Cu is added mainly to improve the electro-migration withstand voltage. The Si is added mainly to improve the alloy spike withstand voltage. In the case in which the two-layered wiring line structure is adopted, the external terminals 15 are formed at the step of forming the wiring lines of the uppermost layer, i.e., the second layer in the fabrication process.

Figure 4:
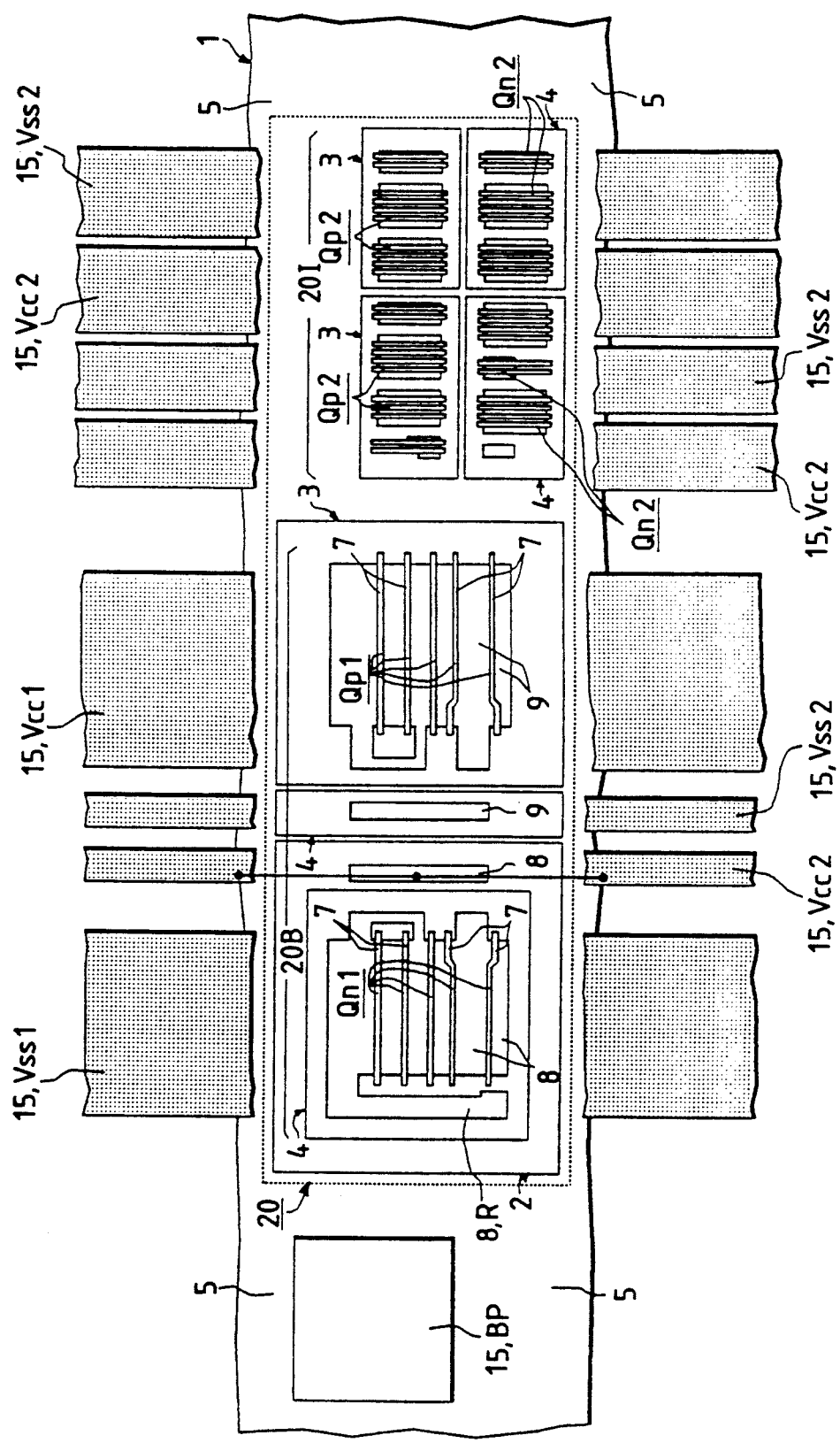
FIG. 4 is a top plan view showing an essential portion of the buffer circuit of the ASIC.

For each of the external terminals, in the regions along the arrays of the external terminals 15, a plurality of buffer circuits 20 are arrayed in the peripheral regions of the ASIC 31 inside of the external terminals 15. An internal circuit 22 is arranged in the region surrounded by the buffer circuits 20, i.e., at the central region of the ASIC 31. The internal circuit 22 is arrayed by providing a repetitive pattern of basic cells 21 or that of minimum functional block units in a matrix form. The internal circuit 22 is a region, in which a plurality of basic cells 21 are combined to constitute a logic circuit system, a memory circuit system or their mixed system. The ASIC of this kind is called the "spread system". The buffer circuits 20 are used as interface circuits between the internal circuit 22 of the ASIC 31 and the outside of the ASIC 31 such as another external device packaged in the aforementioned circuit system The buffer circuit 20 is constructed of buffer circuit cells, each of which is composed of a plurality of complementary MISFETS, as shown in FIG. 4 (showing an essential portion in a top plan view) and FIG. 1 (showing an essential portion in section). The buffer circuit cells are exemplified by an output buffer circuit cell 20B and an input buffer circuit cell 20I. Although the number is not limited, the output buffer circuit cell 20B is composed essentially of five sets of complementary MISFETS, which are exemplified by five n-channel MISFETs Qn1 and five p-channel MISFETs Qp1.

The n-channel MISFET Qn1 constituting the output buffer circuit cell 20B is formed in the principal plane of a p-type well region 4 which is formed in the peripheral region of the principal plane (or main surface) of the p$^-$-type semiconductor substrate 1. The n-channel MISFET Qn1 is formed in a specified active region which is surrounded by an element separating insulating film (or field insulating film) 5. The n-channel MISFET Qn1 is composed mainly of a p-type well region 4 (or a channel forming region), a gate insulating film 6, a gate electrode 7, and a pair of n$^+$-type semiconductor regions 8 acting as source and drain regions. The gate insulating film 6 is made of a silicon oxide film which is prepared by a thermal oxidation, for example. The gate electrode 7 is made of either: a single layer of a polycrystalline silicon film, a refractory metal film, a refractory metal silicide film or the like; or a composite film which is prepared by laminating a refractory metal film or a refractory metal silicide film on a polycrystalline silicon film.

The individual five n-channel MISFETs Qn1 constituting the output buffer circuit cell 20B are sequentially arranged in the gate lengthwise direction. Of these five, one n-channel MISFET Qn1 has one n$^+$-type semiconductor region 8 thereof integrally formed with the other n$^+$-type semiconductor region 8 of the adjacent n-channel MISFET Qn1. The five n-channel MISFETs Qn1 are individually connected in parallel by later-described wiring lines 12. These five n-channel MISFETs Qn1 are formed in the principal plane of one common p-type well region 4.

Moreover, one of the five n-channel MISFETs Qn constituting the output buffer circuit cell 20B has its one n$^+$-type semiconductor region 8 integrally formed and electrically connected with an n$^+$-type semiconductor region 8 to be used as a resistance element R. This resistance element R is used as a protecting resistance element of an electrostatic breakdown preventing circuit to be connected between the external terminal 15 and the input buffer circuit composed of the input buffer circuit cells 20I.

The p-channel MISFET Qp1 constituting the output buffer circuit cell 20B is formed in the principal plane of an n-type well region 3 which is formed in the peripheral region of the principal plane of the p$^-$-type semiconductor substrate 1. The p-channel MISFET Qp1 is formed in the specified active region which is surrounded by the element separating insulating film 5.

The p-channel MISFET Qp1 is composed mainly of the gate insulating film 6, the gate electrode 7, and a pair of p+-type semiconductor regions 9 acting as the source and drain regions.

Moreover, all of the five p-channel MISFETs Qp1 constituting the output buffer circuit cell 20B are integrally formed, like the n-channel MISFET Qn1, with the adjacent p+-type semiconductor region 9 in the gate lengthwise direction and are connected in parallel by the wiring lines 12. These five p-channel MISFETs Qp1 are formed at the principal plane of one common n-type well region.

The input buffer circuit cell 20I of the aforementioned buffer circuit 20 is composed of a plurality of complementary MISFETS. Each of these complementary MISFETs is composed of a plurality of n-channel MISFETs Qn2 and a plurality of p-channel MISFETs Qp2. The complementary MISFETs of the input buffer circuit cell 20I constitute, essentially, the input buffer circuit. In other words, the input buffer circuit cell 20I and the output buffer circuit cell 20B of the buffer circuit 20 are individually constructed into interface circuits to be connected directly with the external device. On the other hand, the complementary MISFETs of the input buffer circuit cell 20I of the aforementioned buffer circuit 20 are also used as a pre-stage logic circuit in the case where the output buffer circuit is composed of the output buffer circuit cell 20B. These complementary MISFETS (Qn2 and Qp2), to be used as the pre-stage logic circuit, are arranged as the input buffer circuit cell 20I of the buffer circuit 20 but are substantially used as a portion of the internal circuit 22 because they are not connected directly with the external circuit. These complementary MISFETs of the input buffer circuit cell 20I will be described in detail in connection with the basic cell 21 because they are constructed to have a structure substantially identical to that of the complementary MISFETs of the basic cells 21 arrayed in the internal circuit 22.

The individual complementary MISFETs (Qn1 and Qp1) constituting the output buffer circuit cell 20B of the aforementioned buffer circuit 20 are connected through the wiring lines 12 to constitute the output buffer circuit. The wiring lines 12 are the lower layer of the two-layered wiring structure and are formed at the first layer wiring line forming step of the fabrication process. The wiring lines 12 extend over an inter-layer insulating film 10, which is formed over the semiconductor elements such as the complementary MISFETS, and are connected, through connection holes 11 formed in that inter-layer insulating film 10, with any of the n+-type semiconductor region 8, p+-type semiconductor region 9 and the gate electrode 7 corresponding to the individual terminals. Likewise, the individual complementary MISFETs (Qn2 and Qp2) constituting the input buffer cell 20I are connected through the wiring lines 12 to form either the input buffer circuit or the pre-stage logic circuit of the output buffer circuit.

A reference supply voltage Vss1 is supplied to the n+-type semiconductor region 8 corresponding to the source region of the n-channel MISFET Qn1 of the complementary MISFETs constituting the output buffer circuit cell 20B of the aforementioned buffer circuit 20. The reference supply voltage Vss1 is exemplified by the earth potential 0 V of the circuit. The reference supply voltage Vss1 is supplied from the reference supply wiring line (Vss1) 15 extending over the complementary MISFETs constituting the output buffer circuit cell 20B. The reference supply wiring line 15 extends over an inter-layer insulating film 13 and is connected once with the wiring line 12 through a connection hole 14 formed in the inter-layer insulating film 13 and further with the n+-type semiconductor region 8 through the wiring line 12. The reference supply wiring line 15 is constituted into the same conducting layer as that of the aforementioned external terminal 15, i.e., the uppermost wiring layer of the two-layered wiring structure.

In the ASIC 31 of the present embodiment, as shown in FIG. 4, the reference supply wiring lines 15 extend over the output buffer circuit cell 20B of the buffer circuit 20. These reference supply wiring lines 15 extend generally in parallel in the array direction of the buffer circuit 20. The reference supply wiring lines 15 supply the reference supply voltage Vss1 to the output buffer circuit which is composed of the output buffer circuit cells 20B.

The reference supply voltage Vss1 thus supplied to the n+-type semiconductor region 8 acting as the source region of the n-channel MISFET Qn1 of the complementary MISFET constituting the aforementioned output buffer circuit cell 20B is also supplied to the p-type well region 4 constituting that n-channel MISFET Qn1. The supplying of the reference supply voltage Vss1 to the p-type well region 4 is provided from the reference supply wiring line 15 through the wiring lines 12 and the p+-type semiconductor region 9.

An operating supply voltage Vcc1 is supplied to the p+-type semiconductor region 9 corresponding to the source region of the p-channel MISFET Qp1 of the complementary MISFET constituting the output buffer circuit cell 20B of the aforementioned buffet circuit 20. The operating voltage Vcc1 is exemplified by the voltage dropping potential 3.3 V (or 5 V) of the circuit. The operating supply voltage Vcc1 is supplied, as shown in FIGS. 1, 3 and 4, from the operating supply wiring lines (vcc1) 15 extending over the complementary MISFET constituting the output buffer circuit cell 20B. The operating supply wiring lines 15 are connected like the reference supply wiring lines 15 with the p+-type semiconductor region 9 through the wiring lines 12.

The operating supply wiring lines 15 extend, as shown in FIG. 4, over the output buffer circuit cell 20B of the buffer circuit 20 like the reference supply wiring lines 15. Those operating supply wiring lines 15 extend generally in parallel in the array direction of the buffer circuit 20. The operating supply wiring line 15 supplies the operating supply voltage Vcc1 to the output buffer circuit which is composed of the output buffer circuit cell 20B.

The operating supply voltage Vcc1 to be supplied to the p+-type semiconductor region 9 acting as the source region of the p-channel MISFET Qp1 of the complementary MISFET constituting the aforementioned output buffer circuit cell 20B is also supplied to the n-type well region 3 constituting the p-channel MISFET Qp1. The supplying of the operating supply voltage Vcc1 to the n-type well region 3 is provided from the operating supply wiring line 15 through the wiring lines 12 and n+-type semiconductor region 8.

A reference supply voltage Vss2 is supplied to the source region (i.e., the n+-type semiconductor region 8) of the n-channel MISFET Qn2 constituting the input buffer circuit cell 20I of the aforementioned buffer circuit 20. The reference supply voltage Vss2 is exemplified by the earth potential 0 V equal to the aforementioned reference supply voltage Vss1 and is separated and electrically isolated from the aforementioned reference power supply Vss1 in the ASIC 31. In other words, the reference supply voltages Vss1 and Vss2 are individually separated within the circuit system to be packaged in the substrate of the aforementioned PCB, and one separated reference supply voltage is independently supplied to the ASIC 31. This independent reference supply voltage Vss1 is supplied mainly to the output buffer circuit cell 20B of the buffer circuit 20, whereas the other reference supply voltage Vss2 is supplied mainly to the input buffer circuit cell 20I of the buffer circuit 20 and the later-described internal circuit 22. In other words, the noises generated in the reference supply voltage Vss1 during operation of the output buffer circuit, constituted by the output buffer circuit cell 20B of the buffer circuit 20, are not propagated to the reference supply voltage Vss2 which is supplied to the input buffer circuit constituted of the input buffer circuit cell 20, the pre-stage logic circuit of the output buffer circuit, or the internal circuit 22. The reference supply voltage Vss2 is supplied, as shown in FIGS. 1, 3 and 4, from the reference supply wiring lines (Vss2) 15 extending over the complementary MISFET constituting the input buffer circuit cell 20I of the buffer circuit 20. The reference supply wiring lines 15 are connected once with the wiring lines 12 and then with the n+-type semiconductor regions 8 through the wiring lines 12. As shown in FIG. 4, the ASIC 31 of the present embodiment is equipped with two reference supply wiring lines 15 extending over the input buffer circuit cell 20I. These two reference supply wiring lines 15 extend generally in parallel in the array direction of the buffer circuit 20 Moreover, the reference supply voltage Vss2 to be supplied to the source region (or the n+-type semsemiconductor region 8) of the n-channel MISFET Qn2 constituting the input buffer circuit cell 201 is also supplied to the p-type well region 4 constituting the n-channel MISFET Qn2.

Likewise, an operating supply voltage Vcc2 is supplied to the source region (or the p+-type semiconductor region 9) of the p-channel MISFET Qp2 of the input buffer circuit cell 20I of the aforementioned buffer circuit 20. The operating supply voltage Vcc2 is exemplified by a voltage dropping potential of 3.3 V equal to that of the aforementioned operating supply voltage Vcc1 and is separated and electrically isolated from the operating supply voltage Vcc1 in the ASIC 31. In other words, this isolated operating supply voltage Vcc1 is supplied mainly to the output buffer circuit cell 20B of the buffer circuit 20, whereas the other operating supply voltage Vcc2 is supplied mainly to the input buffer circuit cell 20I of the buffer circuit 20 and the internal circuit 22. The operating supply voltage Vcc2 is supplied, as shown in FIGS. 1, 3 and 4, from the operating supply wiring lines (Vcc2) 15 extending over the complementary MISFET constituting the input buffer circuit cell 20I. The operating supply wiring lines 15 are connected once with the wiring lines 12 and then through the wiring lines 12 with the p+-type semiconductor regions 9. As shown in FIG. 4, the ASIC 31 of the present embodiment is equipped with two operating supply wiring lines 15 extending over the input buffer circuit cell 20I. The reference supply wiring lines 15 extend generally in parallel in the array direction of the buffer circuit 20. On the other hand, the operating supply voltage Vcc2 to be applied to the source region (i.e., the p+-type semiconductor region 9) of the p-channel MISFET Qp2 of the complementary MISFETs constituting the input buffer circuit cell 20I is also supplied to the n-type well region 3 constituting the p-channel MISFET Qp2.

As shown in FIG. 3, each of the reference supply wiring lines (Vss1) 15 and the operating supply wiring lines (Vcc1) 15 extending over the output buffer circuit cell 20B of the aforementioned buffer circuit 20 are basically divided into a plurality in the extending direction. In the ASIC 31 of the present embodiment, the reference supply wiring lines 15 and the operating supply wiring lines 15 are divided into totally two groups: one group extending along the upper and righthand sides of FIG. 3; and another group extending along the lefthand and lower sides. Since the output buffer circuit composed of the output buffer circuit cells 20B produce high noises during operation thereof, the noises can be scattered by dividing the reference supply wiring lines 15 and the operation supply wiring lines 15, accordingly.

On the other hand, each of the reference supply wiring lines (Vss2) 15 and the operating supply wiring lines (Vcc2) 15 extending over the input buffer circuit cell 20I of the buffer circuit 20 is not divided in the extending direction because lower noises than those of the output buffer circuit are generated in the input buffer circuit composed of the input buffer circuit cell 20I, the pre-stage logic circuit or the internal circuit 22. In other words, each of the reference supply wiring lines 15 (supplying Vss2) and the operating supply wiring lines 15 (Vcc2) extends continuously along each side of the ASIC 31 to effect a ring-shaped top plan view.

Figure 5:
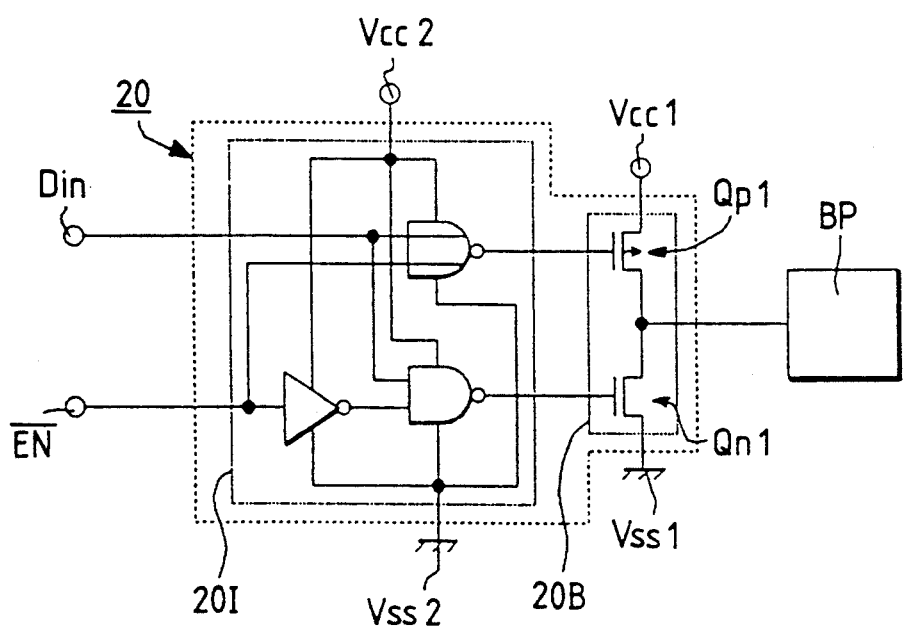
FIG. 5 is a circuit diagram showing one embodiment of the buffer circuit.

The buffer circuit 20 thus constructed can use the buffer circuit cells to constitute the output buffer circuit and the pre-stage logic circuit, as shown in FIG. 5 (presenting an equivalent circuit diagram). In other words, the output buffer circuit is composed of the complementary MISFETs of the output buffer circuit cells 20B of the buffer circuit 20, as has been described hereinbefore. On the other hand, the pre-stage logic circuit of the output buffer circuit is composed of the input buffer circuit cells 20 of the buffer circuit 20. In FIG. 5, reference letters Din designate an input terminal of the output signal, and letters $\overline{EN}$ designate an enable signal terminal In the region of the aforementioned buffer circuit 20, i.e., in the peripheral region of the ASIC 31, as shown in FIGS. 1 and 4, a separating region 2 is formed between the p-type well region 4, which is arranged with the n-channel MISFET Qn1 of the complementary MISFET of the output buffer circuit cell 20B, and the p⁻-type semiconductor substrate 1. The separating region 2 is formed of an n-type semiconductor region (or n-type well region) to cover (i.e., surround) the aforementioned p-type well region 4 along substantially all sides thereof and bottom of the p-type well region 4. In other words, the p-type well region 4 is formed in the principal plane of the separating region (or the n-type semiconductor region) 2 having a larger junction depth than that of the p-type well region 4. Since this separating region 2 is made of the n-type semiconductor region, the p-type well region 4 and the p⁻-type semiconductor substrate 1 are electrically isolated by the pn junction.

The n-type semiconductor region or the aforementioned separating region 2 is supplied with a potential which backward biases (or reverse biases) the junction formed by the p-type well region 4 and the p⁻-type semiconductor region 1. Since the ASIC 31 of the present embodiment uses two supply voltages—the reference supply voltage Vss and the operating supply voltage Vcc, the separating region 2 is supplied with the operating supply voltage Vcc. Although the operating supply voltage Vcc to be supplied to the separating region 2 may be provided by the operating supply voltage Vcc1 (to be supplied to the output buffer circuit cell 20B of the buffer circuit 20), it is, however, exemplified by an operating supply voltage Vcc2 (to be supplied to the input buffer circuit cell 20I or the internal circuit 22) that has less noises and, therefore, a more stable potential. The supply of the operating supply voltage Vcc2 to the separating region 2 is accomplished, as shown in FIGS. 1, 3 and 4, by the operating supply wiring lines (Vcc2) 15 which are extracted either directly from the external terminals 15 or from the operating supply wiring lines (Vcc2) 15 extending over the aforementioned input buffer circuit cell 20I. These operating supply wiring lines 15 supply the operating supply voltage Vcc2 to the separating region 2 through the wiring lines 12 and the n+-type semiconductor region 8.

The aforementioned separating region 2 is integrally made and electrically connected with another, adjacent separating region 2 extending in the array direction of the buffer circuit 20. As enclosed by double-dotted lines 2 in FIG. 3, the individual separating regions 2 of the buffer circuits 20 arrayed along one side of the square of the ASIC 31 are integrated and united with one another. The separating regions 2 along each of the respective sides of the ASIC 31 are united but, however, are separated and electrically isolated from those separating regions 2 arranged along respectively different sides therefrom of the ASIC 31. The unitization of the separating regions 2 refers to that of the p-type well regions 4 in the output buffer circuit cells 20B of the buffer circuits 20. On the other hand, the separation of the separating regions 2 refers to that of the p-type well regions 4 in the output buffer circuit cells 20B which are united for each side of the ASIC 31. In the case where the separating regions 2 are separated from one another and arranged for each of the buffer circuits 20, they are featured in that they separate the p-type well region 4 from the p⁻-type semiconductor substrate 1 so that they can freely allow the setting of the supply voltage or signal level to be supplied to the p-type well region 4 or the n-channel MISFET Qn1 formed in the principal plane of the region 4. On the contrary, the separating regions 2 do not require that they be separately disposed and electrically isolated from each other, such as, when they are united in each of the buffer circuits 20 (e.g., along one side of the ASIC). As a result, the area to be occupied by the separating regions 2 can be reduced to an extent corresponding to the isolating regions. The ASIC 31 can be effected with separate regions as the separating regions 2 for each buffer circuit 20 or with a single (united) region as the separating regions 2. However, the ASIC of the present embodiment is constructed to have the structure capable achieving the aforementioned features of the two by uniting the separating regions 2 of a predetermined number of buffer circuits 20 and by separating the united separating regions 2 of one predetermined number of buffer circuits 20 from the united separating regions 2 of another predetermined number of buffer circuits 20.

The n-type well region 3 arranged with the p-channel MISFET Qp1 of the output buffer circuit cell 20B of the aforementioned buffer circuit 20 is basically separated electrically from the p⁻-type semiconductor substrate 1 by the pn junction. Thus, with a view to reducing the area to be occupied by the buffer circuit 20, the separating region 2 is formed between the p-type well region 4 arranged with the n-channel MISFET Qn1 of the output buffer circuit cell 20B and the p⁻-type semiconductor substrate 1. Basically, the separating region 2 is not formed in the regions of the input buffer circuit cell 20I of the buffer circuit 20 and the internal circuit 22 likewise with a view to reducing the occupied area. Moreover, the n-type well region 3 in the output buffer circuit cell 20B of the buffer circuit 20 is united or separated like the p-type well region 4 in the output buffer circuit cell 20B. Basically, still moreover, the p-type well region 4 and the n-type well region 3 in the input buffer circuit cell 20I of the buffer circuit 20 are united or separated in a manner to correspond to the unitization and separation of the p-type well region 4 and the n-type well region 3 in the output buffer circuit cell 20B.

In the fabrication process of the ASIC 31, the aforementioned separating region 2 is formed by doping the buffer circuit forming region (or the peripheral region) of the principal plane of the p⁻-type semiconductor substrate 1 with an n-type impurity and by dividing that n-type impurity. This n-type impurity is introduced by the ion implantation or the solid phase diffusion. The n-type well region 3 and the p-type well region 4 are individually formed after the separating regions 2 have been formed. In other words, the n-type semiconductor region or the separating region 2 is formed at a step before and different from that of the n-type well region 3.

On the other hand, the separating region 2 may be formed at the same step as that of the n-type well region 3. In this case, the n-type well region 3 acting as the separating region 2 is formed, and then its principal plane is formed with the p-type well region 4.

Next, the structure of the basic cell 21 for forming the internal circuit 22 of the aforementioned ASIC 31 will be briefly described with reference to FIGS. 1 and 6 (showing an essential portion in a top plan view).

Figure 6:
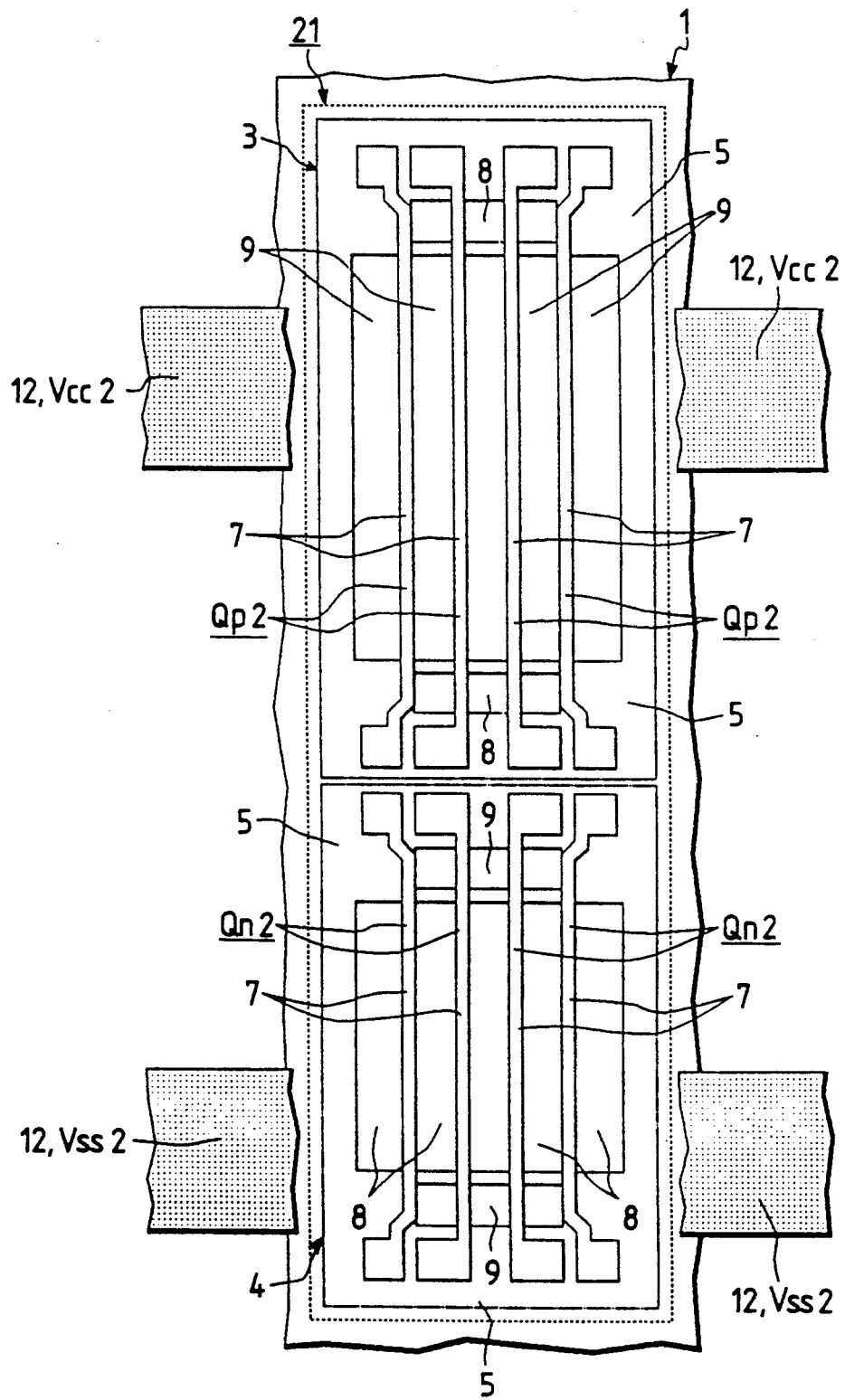
FIG. 6 is a top plan view showing an essential portion of a basic cell arranged in an internal circuit of the ASIC.

As shown in FIGS. 1 and 6, the basic cell 21 is composed of totally four sets of complementary MISFETs—four n-channel MISFETs Qn2 and four p-channel MISFETs Qp2.

The n-channel MISFETs Qn2 of the aforementioned basic cell 21 are formed in the principal plane of the p-type well region 4 in the active region having its periphery specified by the element separating insulating film 5. The n-channel MISFETs Qn2 are composed mainly of the p-type well region 4, the gate insulating film 6, the gate electrode 7 and a pair of n+-type semiconductor regions 8 for providing the source region and the drain region.

The p-channel MISFETs Qp2 of the basic cell 21 are likewise formed in the principal plane of the n-type well region 3 in the active region having its periphery specified by the element separating insulating film 5. The p-channel MISFETs Qp2 are composed mainly of the n-type well region 3, the gate insulating film 6, the gate electrode 7 and a pair of n+-type semiconductor regions 9 for providing the source region and the drain region.

The four n-channel MISFETs Qn2 of the aforementioned basic cell 21 are integrally made in the gate lengthwise direction like the aforementioned buffer circuit 20. Likewise, the four p-channel MISFETs Qp2 are integrally made in the gate lengthwise direction.

This basic cell 21 is constructed to have a layout capable of arranging a four-input NAND gate circuit simply. The basic cells 21 have their individual complementary MISFETs connected by the wiring lines 12. The basic cells 21 or a plurality of combined basic cells 21 constitute a clock buffer circuit L1, a logic circuit L2 or L3, and so on, as shown in FIG. 3. The connections (including the supply wiring lines) between the basic cells 21 have their transverse ones made of the wiring lines 12 and their longitudinal ones made of the wiring lines 15, as shown in FIG. 3. The internal connections of the basic cells 21 and the connections between the basic cells 21 are automatically laid out by the design automation system using a computer.

The reference supply voltage Vss2 is supplied to both the n+-type semiconductor region 8 corresponding to the source region of the n-channel MISFET Qn2 of the basic cell 21 and the p-type well region 4 arranged with the n-channel MISFET Qn2. The reference supply voltage Vss2 is supplied, as shown in FIGS. 3 and 6, from the reference supply wiring lines (Vss2) 15 extending over the input buffer circuit cell 20I of the buffer circuit 20 to the basic cell 21 through the reference supply wiring lines (Vss2) 12 extending over the basic cell 21. Likewise, the operating supply voltage Vcc2 is supplied to the p+-type semiconductor region 9 corresponding to the source region of the p-channel MISFET Qp2 of the basic cell 21 and the n-type well region 3 arranged with the p-channel MISFET Qp2. The operating supply voltage Vcc2 is supplied, as shown in FIGS. 3 and 6, from the operating supply wiring lines (Vcc2) 15 extending over the input buffer circuit cell 20I of the buffer circuit 20 to the basic cell 21 through the operating supply wiring lines (Vcc2) 12 extending over the basic cell 21. Incidentally, the complementary MISFETs constituting the input buffer circuit cell 20I of the aforementioned buffer circuit 20 are constructed to have a structure substantially identical to that of the complementary MISFETs constituting the basic cell 21. Moreover, the p-type well region 4 and the n-type well region 3 in the basic cell 21 are integrated basically for a predetermined number of basic cells 21, and these integrated p-type well region 4 and n-type well region 3 are individually separated and isolated.

The ASIC 31 thus constructed can achieve the following operational effects.

(1) The ASIC 31, in which the output buffer circuit cell 20B of the buffer circuit 20 having the n-channel MISFET Qn1 and arranged in the peripheral region of the principal plane of the p⁻-type semiconductor substrate 1 is supplied with the reference supply voltage Vss1 and in which the internal circuit 22 (including the input buffer circuit cell 20I of the buffer circuit 20) formed of complementary MISFETs and arranged at the central region of the principal plane of said p⁻-type semiconductor substrate 1 is supplied with the reference supply voltage Vss2 independent of said reference supply voltage Vss1, is constructed: such that the n-channel MISFET Qn1 of the output buffer circuit cell 20B of said buffer circuit 20 is formed in the principal plane of a p-type well region 4 formed in the principal plane of said p⁻-type semiconductor substrate 1; and such that there is formed between said p-type well region 4 and said p⁻-type semiconductor substrate 1 a separating region 2 for isolating the two electrically. According to such structure, when noises (or potential fluctuations) are produced in the reference supply voltage Vss1 during operation of the output buffer circuit, composed of the output buffer circuit cell 20B of said buffer circuit 20, the trigger currents (as indicated at reference letter I in FIG. 1) individually flowing through said p-type well region 4 and said p⁻-type semiconductor substrate 1 on the basis of the difference between the potentials of the reference supply voltage Vss1 and the reference supply voltage Vss2 can be shielded by said separating region so that the start (e.g., triggering) of the parasitic thyristor composed of the complementary MISFETs of said p⁻-type semiconductor substrate 1 and said internal circuit 22 can be suppressed to thereby improve the latch-up breakdown voltage of the ASIC 31.

Figure 8A:
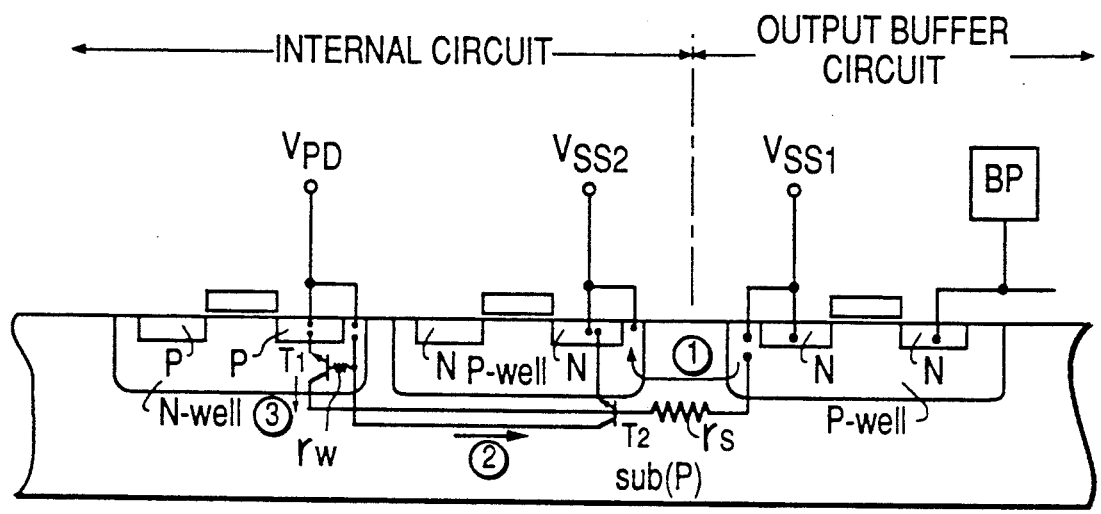
FIGS. 8(*a*) and 8(*b*) are schematic showings (for purposes of discussion) of thyristor latch-up that would be effected without improvements according to Embodiments I and II.
Figure 8B:
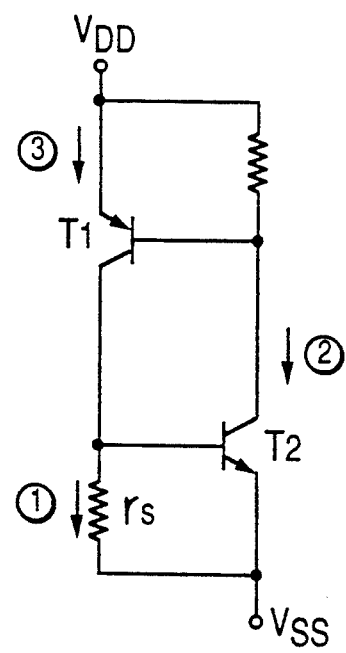

FIG. 8(a) and FIG. 8(b), the latter showing the effected thyristor latch-up in the embodiment of FIG. 8(a) when a separating region such as well region 2 is not included therein, represent a schematic example of thyristor latch-up resulting from trigger currents (e.g., trigger current I in FIG. 1) flowing through the well region 4 and the semiconductor substrate 1 which are induced by potential differences between the independently supplied reference voltages Vss1 and Vss2. Such potential differences result from fluctuations of, for example, Vss1 during operation of the related output buffer circuit to which Vss1 is supplied. That is, a fluctuation in the ground potential (e.g., Vss1) would result in a relative potential difference with that of internal grounding voltage Vss2 that would produce an undesirable triggering of the parasitically formed thyristor circuit, such as, shown in FIG. 8(a). The circuit connection effected from the parasitically formed pnp and npn transistors T1 and T2 in FIG. 8(a) is schematically shown in FIG. 8(b). This problem of thyristor latch-up arises between the complementary MISFETs in the internal circuit as noted in FIG. 8(a). That is, during operation of the output buffer circuits, the noise buildup of the voltage source (e.g., Vss1) results in a potential difference between voltage source Vss1 which is applied to the output buffer circuit (e.g., the source of n-channel MISFETs Qn1 in FIG. 1) with that of the grounding potential (e.g., Vss2) which is independently provided to the MISFETs of the internal circuits (e.g., Qn2 in FIG. 1). As a result, therefore, this potential difference when involving, especially, a large number of output buffers, can be great enough to effect a large enough current to act as a trigger current on the thyristor inherently present, e.g., adjacent complementary MISFETs in the internal circuit, and which thyristor results from the pnpn junctions effected by the well regions and substrate.

(2) The separating region 2 of the aforementioned structure (1) is made of an n-type semiconductor region surrounding said p-type well region 4, and, in this n-type semiconductor region, the supply voltage (to be supplied to said internal circuit 22) is supplied to effect a backward bias (or reverse bias) to said p-type well region 4 and said p⁻-type semiconductor substrate 1. In accordance with such structure, the n-type semiconductor region of said separating region 2 supplies a more stable operating supply voltage Vcc2, i.e. one having less noises, than the operating supply voltage Vcc1 which is frequently provided with noises during operation of the output buffer circuit, composed of the output buffer circuit cell 20B of said buffer circuit 20. As a result, the shielding ability of said trigger current can be enhanced to improve the latch-up withstand voltage of the ASIC 31 substantially.

(3) The output buffer circuit cell 20B of the buffer circuit 20 of the aforementioned structure (1) or (2)

includes complementary MISFETs, i.e. an n-channel MISFET Q1 and a p-channel MISFET Qp1. In accordance with such structure, the output signal of the complementary MISFETs of the output buffer circuit cell 20B of said buffer circuit 20 is not lowered by the voltage drop corresponding to the threshold voltage at its high level. That is, the output buffer circuit can have its operating voltage range maximally extended when it is constructed of the output buffer circuit cell 20B of the buffer circuit 20. As a result, the interface at the TTL level can be realized even when the level of the operating supply voltage Vcc1 to be supplied to the output buffer circuit is dropped from 5 V to 3.3 V on the basis of the proportional contraction rule.

(4) The complementary MISFETs of the output buffer circuit cell 20B of the buffer circuit of the aforementioned structure (3) has its n-channel MISFET Qn1 formed in the principal plane of said p-type well region 4 and its p-channel MISFET Qp1 formed in the principal plane of the n-type well region 3, and said separating region 2 is formed only between said p-type well region 4 and said p⁻-type semiconductor substrate 1. In such structure, since the n-type well region 3 is, essentially, electrically isolated from the p⁻-type semiconductor substrate, the separating region 2 in this region can be omitted. As a result, the area to be occupied by the buffer circuit 20 can be reduced to an extent corresponding to the omitted separating region 2 to thereby improve the degree of integration of the ASIC 31.

(5) The separating region 2 is formed only between the p-type well region 4 formed with the n-channel MISFET Qn1 of the output buffer circuit cell 20B, of the buffer circuit 20 of any of the aforementioned structures (1) to (4), and said p⁻-type semiconductor substrate 1 but not between the n-channel MISFET Qn2 (or the p-type well region 4) of the complementary MISFET of said internal circuit 22 and said p⁻-type semiconductor substrate 1. In accordance with such structure, the p-type well region 4 of the output buffer circuit cell 20B, of the buffer circuit 20, acting as the source for generating the trigger current is electrically isolated from said p⁻-type semiconductor substrate 1 to improve the latch-up withstand voltage in the region of the internal circuit 22. As a result, said separating region 2 in the region of that internal circuit 22 can be omitted so that the area to be occupied by the internal circuit 22 can be reduced to an extent corresponding to the omitted separating region 2 to improve the degree of integration of the ASIC 31.

(6) The buffer circuit 20 of any of the aforementioned structures (1) to (5) is arranged in plurality in the peripheral region of the principal plane of said p⁻-type semiconductor substrate 1, and the individual separating regions 2 of the adjacent ones of the plurality of buffer circuits 20 are integrally formed. According to such structure, the separate regions between the individual separating regions 2 of the plurality of buffer circuits 20 can be eliminated so that the area to be occupied by the peripheral region (i.e., the region to be arranged with the buffer circuits 20) of the principal plane of the p⁻-type semiconductor substrate 1 can be reduced to an extent corresponding to those separate regions to improve the degree of integration of the ASIC 31.

(7) The buffer circuit 20 of any of the aforementioned structures (1) to (5) is arranged in plurality in the peripheral region of the principal plane of the p⁻-type semiconductor substrate 1, and the plurality of buffer circuits 20 have their individual p-type well regions (or the p-type well region 4 and the n-type well region 3) separated from one another, or each and every group consisting of a predetermined number of the plurality of buffer circuits have their p-type well regions (or the p-type well regions 4 and the n-type well regions 3) integrally formed such that respective integrally formed p-type well regions 4 (or p-type well region 4 and the n-type well region 3) are separated from one another, so that each and every one of the separated buffer circuits 20 are independently supplied with said reference supply voltage Vss1 (or the reference supply voltage Vss1 and the operating supply voltage Vcc1). As a result of such structure, when a plurality of buffer circuits 20, which are composed of the output buffer circuit cells 20B, are simultaneously operated, the noises produced in said reference supply voltage Vss1 (or the operating supply voltage Vcc1) are scattered everywhere the separating regions are separated, so that these individual scattered noises can be reduced. As a result, said trigger current can be lowered to thereby improve the latch-up withstand voltage of the ASIC 31 better. Moreover, either the individual ones of the plurality of buffer circuits 20 or each and every group consisting of a predetermined number of the plurality of buffer circuits 20 are separated and electrically isolated through said separating regions 2 and the p⁻-type semiconductor substrate 1 so that the individual levels of the reference supply voltage Vss1 (or the operating supply voltage Vcc1) to be individually supplied to said buffer circuits 20 can be set to a plurality of kinds (e.g., different voltage levels). For example, the reference supply voltage Vss1 can be set to two kinds, i.e., 0 V and 1 V. In other words, the ASIC 31 can cover the range (of the input/output signal levels) of a plurality of kinds of operating voltages.

On the other hand, the aforementioned separating region 2 may be formed in the region of the clock buffer circuit L1 of the internal circuit 22, as shown in FIG. 3. The clock buffer circuit L1 is supplied with the supply voltage which is separated and electrically isolated from the reference supply voltage Vss1 and the operating supply voltage Vcc1 (to be supplied to said buffer circuit 20) and from the reference supply voltage Vss2 and the operating supply voltage Vcc2 to be fed to the internal circuit 22 except the clock buffer circuit L1. On the other hand, the clock buffer circuit L1 has such a high driving ability that it acts as a source for causing the noises.

Incidentally, the ASIC 3 of the foregoing embodiment adopts the twin well structure having the n-type well region 3 and the p-type well region 4. However, the present invention should not be limited to that structure but may adopt a single well structure having the n-type well region 4 only in the ASIC 31.

Moreover, the ASIC 31 of the foregoing embodiment adopts the single drain structure in the complementary MISFETs composing the basic cell 21 of the internal circuit 22. However, the present invention may also adopt the LDD (Lightly Doped Drain) structure in the complementary MISFETs of the ASIC 31.

Still moreover, although the ASIC 31 of the foregoing embodiment adopts the two-layer wiring structure, an ASIC according to the present invention may instead adopt a multi-layer wiring structure having three or more wiring layers.

Embodiment II

The present Embodiment II is one in which the aforementioned ASIC 31 is constructed of the n-type semiconductor substrate.

The structure of the ASIC according to the Embodiment II of the present invention is shown in FIG. 7 (showing an essential portion in section.

As shown in FIG. 7, the ASIC 31 of the present Embodiment II is constructed mainly of an n⁻-type semiconductor substrate 1. The separating region 2 is arranged between the n-type well region 3 to be arranged with the p-channel MISFET Qp1 of the output buffer circuit cell 20B of the buffer circuit 20 of the ASIC 31 and the n⁻-type semiconductor substrate 1. The separating region 2 thus arranged is formed of the p-type semiconductor region and supplied with the reference supply voltage Vss2. The p-type well region 4 to be arranged with the n-channel MISFET Qn1 of the output buffer circuit cell 20B of the buffer circuit 20 is electrically isolated from the n⁻-type semiconductor substrate 1; therefore, it does not require the separating region 2.

Although our invention has been specifically described in connection with the foregoing embodiments, it should not be limited thereto but can naturally be modified in various manners without departing from the gist thereof.

For example, the present invention can be applied to the ASIC adopting a fixed channel system, in which wiring channel regions are arranged between basic cell rows arranged with a plurality of basic cells The present invention can also be applied to a semiconductor integrated circuit device which is constructed by a system such as the gate array system, the standard cell system or the master slice system.

Moreover, the present invention should not have its application limited to the ASIC but can be applied widely to a semiconductor integrated circuit device such as a logic LSI or a memory LSI, in which the supply voltage is divided for the buffer circuit and the internal circuit and in which the internal circuit has complementary MISFETs.

Furthermore, the present invention can be applied to the ASIC which is packaged with the complementary MISFET and the bipolar transistor.

Furthermore, the present invention can be applied to the ASIC, in which the output buffer circuit is constructed of a push-pull circuit.

The effects to be obtained by the representative of the invention to be disclosed herein will be summarized in the following.

(1) The semiconductor integrated circuit device, in which the supply voltages to be individually supplied to the internal circuit, having complementary MISFETs, and the buffer circuit are independent of each other, can have its latch-up withstand voltage improved.

(2) In addition to the aforementioned effect (1), the buffer circuit can have its operating voltage range extended.

(3) In addition to the aforementioned effect (2), the area to be occupied by the output buffer can be reduced to improve the degree of integration of the semiconductor integrated circuit device.

(4) In addition to any of the aforementioned effects (1) to (3), the area to be occupied by the aforementioned internal circuit can be reduced to improve the degree of integration of the semiconductor integrated circuit device.

(5) In addition to any of the aforementioned effects (1) to (4), it is possible to freely set the level of the supply voltage to be supplied to the aforementioned output buffer circuit.

What is claimed is:

1. A semiconductor integrated circuit device, comprising:

a semiconductor substrate having a first conductivity type;

a plurality of first well regions of said first conductivity type and a plurality of second well regions of a second conductivity type, opposite to said first conductivity type, said plurality of first well regions and said plurality of second well regions being formed in said semiconductor substrate;

an output buffer circuit including a first MISFET of a second channel conductivity type formed in one of said plurality of first well regions, and a second MISFET of a complementary first channel conductivity type formed in one of said plurality of second well regions and in series therewith between connections for applying a potential difference thereto, wherein said one of said plurality of first well regions and a source region of said first MISFET are disposed to be supplied with a first supply voltage and said one of said plurality of second well regions and a source region of said second MISFET are disposed to be supplied with a second supply voltage;

a bonding pad electrically connected to drain regions of said first and second MISFETs; and an internal circuit having complementary MISFETs including a third MISFET of said second channel conductivity type formed in another of said plurality of first well regions, and a fourth MISFET of said first channel conductivity type formed in another one of said plurality of second well regions and in series therewith between connections for applying a potential difference thereto, wherein said another one of said plurality of first well regions and a source region of said third MISFET are disposed to be supplied with a third supply voltage which is equal to that of said first supply voltage and is independent of said first supply voltage at least over said semiconductor substrate and said another one of said plurality of second well regions and a source region of said fourth MISFET are disposed to be supplied with a fourth supply voltage which is equal to that of said second supply voltage and is independent of said second supply voltage at least over said semiconductor substrate, wherein said one of said plurality of first well regions in which said first MISFET is formed is surrounded with a third well region of said second conductivity type, and wherein said third well region is disposed to be supplied with said fourth supply voltage.

2. A semiconductor integrated circuit device according to claim 1, wherein said third well region is disposed to be supplied with a voltage to provide a reverse bias between said third well region and said one of said plurality of first well regions.

3. A semiconductor integrated circuit device according to claim 2, wherein said first and second conductivity types are p-type and n-type, respectively.

4. A semiconductor integrated circuit device according to claim 2, wherein said first and second conductivity types are n-type and p-type, respectively.

5. A semiconductor integrated circuit device according to claim 1, wherein said first and second conductivity types are p-type and n-type, respectively.

6. A semiconductor integrated circuit device according to claim 5, wherein said first and third supply voltages are at ground potential and said second supply voltage is a positive potential.

7. A semiconductor integrated circuit device according to claim 1, wherein said first and second conductivity types are n-type and p-type, respectively.

8. A semiconductor integrated circuit device according to claim 7, wherein said first and third supply voltages are positive voltages of the same potential and said second and fourth supply voltages are at ground potential.

* * * * *